(12) United States Patent
Colvin et al.

(10) Patent No.: US 11,062,873 B2
(45) Date of Patent: Jul. 13, 2021

(54) HYDROGEN BLEED GAS FOR AN ION SOURCE HOUSING

(71) Applicant: Axcelis Technologies, Inc., Beverly, MA (US)

(72) Inventors: Neil K Colvin, Merrimack, NH (US); Tseh-Jen Hsieh, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/409,423

(22) Filed: May 10, 2019

(65) Prior Publication Data

US 2019/0348252 A1 Nov. 14, 2019

Related U.S. Application Data

(60) Provisional application No. 62/670,307, filed on May 11, 2018.

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/006* (2013.01)

(58) Field of Classification Search
CPC .. H01J 37/08; H01J 37/3171; H01J 2237/006; H01J 2237/0213; H01J 2237/022
USPC ................ 250/423 R, 424, 493.1, 425, 426
See application file for complete search history.

(56) References Cited

U.S. PATENT DOCUMENTS

| 7,586,109 B2 * | 9/2009 | Perel | H01J 37/08 250/423 R |
|---|---|---|---|
| 8,000,080 B2 | 8/2011 | Krause | |
| 2010/0107980 A1 * | 5/2010 | Horsky | H01J 27/024 118/723 E |

FOREIGN PATENT DOCUMENTS

FR 2926301 A1 7/2009

OTHER PUBLICATIONS

International Search Report and Written Opinion dated Oct. 22, 2019 in connection with PCT/US2019/031970.

* cited by examiner

*Primary Examiner* — Michael Maskell
(74) *Attorney, Agent, or Firm* — Eschweiler & Potashnik, LLC (57) ABSTRACT

A terminal system for an ion implantation system has an ion source with a housing and extraction electrode assembly having one or more aperture plates. A gas box is electrically coupled to the ion source. A gas source is within the gas box to provide a gas at substantially the same electrical potential as the ion source assembly. A bleed gas conduit introduces the gas to a region internal to the housing of the ion source and upstream of at least one of the aperture plates. The bleed gas conduit has one or more feed-throughs extending through a body of the ion source assembly, such as a hole in a mounting flange of the ion source. The mounting flange may be a tubular portion having a channel. The bleed gas conduit can further have a gas distribution apparatus defined as a gas distribution ring. The gas distribution ring can generally encircle the tubular portion of the mounting flange.

19 Claims, 5 Drawing Sheets

HYDROGEN BLEED GAS FOR AN ION SOURCE HOUSING

REFERENCE TO RELATED APPLICATIONS

This application is a U.S. Non-Provisional application which claims the benefit of U.S. Provisional Application Ser. No. 62/670,307 filed May 11, 2018, entitled "HYDROGEN BLEED GAS FOR AN ION SOURCE HOUSING", the contents of which are herein incorporated by reference in their entirety.

TECHNICAL FIELD

The present invention relates generally to ion implantation systems, and more specifically to an ion implantation system having a hydrogen bleed gas for an ion source of the ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources in ion implanters typically generate the ion beam by ionizing a source material in an arc chamber, wherein a component of the source material is a desired dopant element. The desired dopant element is then extracted from the ionized source material in the form of the ion beam. In some instances, the desired dopant element may comprise ions of a metal, such as aluminum.

Conventionally, when aluminum ions are the desired dopant element, materials such as aluminum nitride (AlN) and alumina ($Al_2O_3$) have been used as a source material of aluminum ions for the purpose of ion implantation. Aluminum nitride or alumina are solid, insulative materials which are typically placed in the arc chamber where the plasma is formed (in the ion source). An etchant gas (e.g., a gas containing fluorine) is conventionally introduced to chemically etch the aluminum-containing materials, whereby the source material is ionized, and aluminum is extracted and transferred along the beamline to silicon carbide workpiece positioned in an end station for implantation thereto. The etching process, however, produces insulating material (e.g., $AlF_x$, AlN, $Al_2O_3$, etc.) which is emitted along with the intended aluminum ions from the arc chamber, whereby the insulating material can cause deleterious arcing between various components of the ion implantation system.

SUMMARY

The following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes for implanting aluminum ions into a workpiece. According to one exemplary aspect, an ion implantation system is provided having an ion source configured to form an ion beam, a beamline assembly configured to selectively transport the ion beam, and an end station is configured to accept the ion beam for implantation of the aluminum ions into a workpiece.

In accordance with one exemplary aspect, a terminal system for an ion implantation system is provided. The terminal system, for example, comprises an ion source assembly generally having a housing and an extraction electrode assembly having one or more aperture plates. A gas box, for example, is electrically coupled to the ion source assembly, and a gas source is disposed within the gas box. The gas source, for example, is configured to provide a gas at substantially the same electrical potential as the ion source assembly. Further, a bleed gas conduit is provided and is associated with the ion source assembly, wherein the bleed gas conduit is configured to introduce the gas to a region generally internal to the housing of the ion source assembly and upstream of one or more of the one or more aperture plates.

In accordance with one example, the bleed gas conduit comprises one or more feed-throughs extending through a body of the ion source assembly. The one or more feed-throughs, for example, may comprise a hole in a mounting flange of the ion source assembly. The mounting flange, for example, may comprise a tubular portion having a channel defined therein. In another example, the bleed gas conduit further comprises a gas distribution apparatus. The gas distribution apparatus, for example, may comprise a gas distribution ring. The gas distribution ring, in one example, generally encircles the tubular portion of the mounting flange.

In accordance with another example, the gas distribution apparatus comprises a plurality of distribution holes located around a circumference thereof. The gas distribution apparatus, for example, may be is positioned internal to the housing and upstream of a ground plate of the extraction electrode assembly.

According to yet another exemplified aspect of the disclosure, the hydrogen gas source comprises a hydrogen generator. In one example, the ion source and gas box are electrically isolated from a remaining portion of the terminal system via a plurality of electrical insulators. In another example, a plurality of insulating standoffs are provided, whereby the plurality of insulating standoffs electrically isolate the terminal system from earth ground. The gas, for example, may comprise one of a reactive gas and an inert gas, such as hydrogen gas and xenon, respectively.

According to other exemplified aspects, an ion implantation system is provided, wherein the ion implantation system comprises the aforementioned terminal. In another exemplified aspect, a method for increasing a lifetime of an ion source is provided. The method, for example, comprises injecting a gas internal to a housing of the ion source. The gas, for example, is configured to react with undesirable by-products of a formation of ions within the ion source, wherein the reaction is configured to prevent a formation of undesirable contaminants on one or more surfaces internal to the ion source housing and external to the ion source assembly. The gas, for example, may comprise hydrogen. The one or more surfaces, for example, may comprise an insulator surface associated with the ion source. Further, injecting the gas may comprise providing the gas to a gas distribution ring having a plurality of distribution holes, wherein the gas distribution ring is positioned internal to the housing of the ion source and upstream of an extraction electrode ground plate.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

The present disclosure is directed generally toward an ion implantation system and a source for providing hydrogen gas to an ion source associated therewith. More particularly, the present disclosure is directed toward hydrogen generation components for generating hydrogen for said ion implantation system and for providing the hydrogen gas to a location internal to a housing of the ion source assembly upstream of an extraction aperture or electrode assembly. The present disclosure positions a hydrogen gas generator in a gas box associated with an ion source assembly, whereby the gas box is maintained at an elevated voltage. Accordingly, containment and safety aspects of the gas box enclosure advantageously ameliorate duplicative hardware and gas delivery piping. Another method is to split the hydrogen process gas flow prior to the arc chamber body gas inlet and proportion that the hydrogen process gas flow using a fixed or variable metering device.

The present disclosure further allows for the introduction of a hydrogen gas bleed into a source housing chamber which is at a ground and/or return potential. By providing a hydrogen gas bleed in the gas box, containment and safety aspects of the gas box enclosure can be utilized, thus advantageously avoiding duplicitous hardware. In one example, the bleed gas material can be enclosed in a secondary gas box which is at ground or return potential. The bleed gas material can be located at ground or return potential, whether the bleed gas material is located within an enclosure or not within an enclosure.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Figure 1:
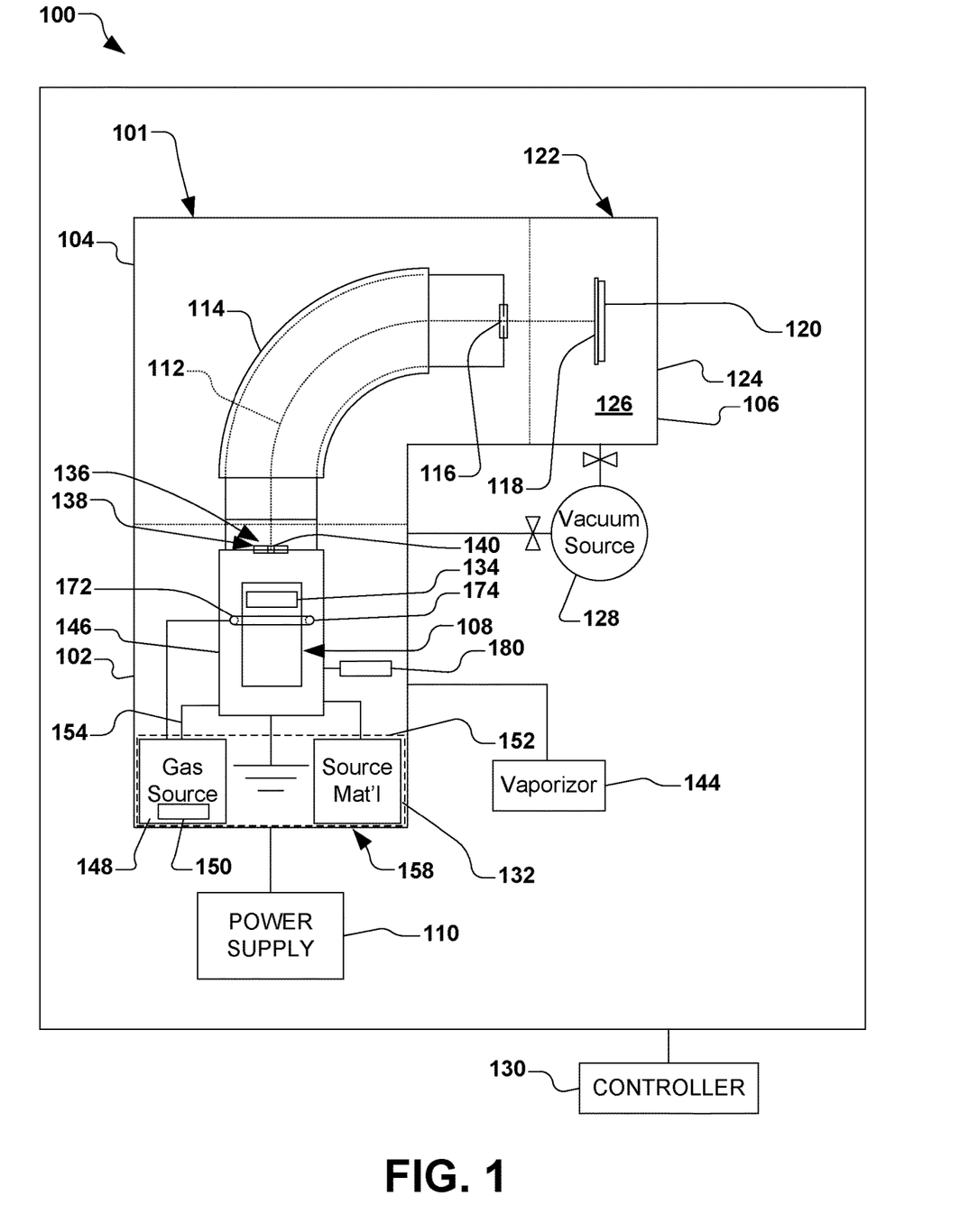
FIG. 1 is a block diagram of an exemplary vacuum system utilizing a hydrogen generator in accordance with several aspects of the present disclosure.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source assembly 108 in the terminal 102 is coupled to a power supply 110 to ionize a dopant material into a plurality of ions from the ion source assembly to form an ion beam 112.

The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. The vacuum source 128 may comprise one or more vacuum pumps operably coupled to one of more of the terminal 102, beamline assembly 104, and end station 106 for selective evacuation, thereof. Further, a controller 130 is provided for selective control of the vacuum system 100.

The present disclosure appreciates that workpieces 118 having silicon carbide-based devices formed thereon have been found to have better thermal and electrical characteristics than silicon-based devices, in particular, in applications used in high voltage and high temperature devices, such as electric cars, etc. Ion implantation into silicon carbide, however, utilizes a different class of implant dopants than those used for workpieces 118 comprised of silicon. In silicon carbide implants, for example, aluminum and nitrogen implants are often performed. Nitrogen implants, for example, are relatively simple, as the nitrogen can be introduced as a gas, and provides relatively easy tuning, cleanup, etc. Aluminum, however, is more difficult, as there are few good gaseous solutions of aluminum heretofore known.

According to the present disclosure, an ion source material 132 is further provided to an arc chamber 134 of the ion source assembly 108 for the production of ions associated with the ion beam 112. The ion source material 132, for example, may comprise iodide-based dopants such as aluminum(III) iodide ($AlI_3$), halogen-based dopants such as $SbF_3$, and chlorine-based dopants such as $AlCl_3$, among others, as will be discussed in further detail infra.

Conventionally, materials such as aluminum nitride (AlN), alumina ($Al_2O_3$), etc. have been used as the source material 132 for aluminum ions for the purpose of ion implantation. Aluminum nitride or alumina are generally solid, insulative materials which can be provided as source materials 132 in the arc chamber 134 of the ion source 108 assembly where a plasma of ions is formed. Source materials 132 containing aluminum, for example, are commonly used with a provision of some form of etchant gas (e.g., $BF_3$, $PF_3$, $NF_3$, etc.) in the arc chamber 134 to form aluminum ions. Accordingly, in one example, an etchant gas such as fluorine is introduced to the arc chamber 134 to chemically etch the aluminum-containing source materials 132, whereby the aluminum is ionized, and aluminum ions are extracted and transferred along the beamline in the form of the ion beam 112 to the workpiece 118 (e.g., a silicon carbide workpiece) positioned in the end station 106. These materials, however, have the unfortunate side effect of producing insulating material (e.g., AlN, $Al_2O_3$, etc.) which is emitted along with the intended ions from the arc chamber.

For example, an extraction electrode assembly 136 comprising one or more electrodes 138 is provided to extract ions from the ion source assembly 108 through an extraction aperture 140, whereby the one or more electrodes in close proximity to the extraction aperture may be biased to inhibit back streaming of neutralizing electrons close to the ion source assembly, or back to the extraction electrode. As such, the aforementioned insulating material, for example, can subsequently coat various electrodes and components such as the extraction electrode assembly 136 associated with the ion source assembly 108. Such a coating of insulating material may build up electrical charge and unfavorably alter the electrostatic characteristic of these electrodes.

Such a build-up of insulating material can result in behavior commonly referred to as glitching, or arcing, of the electrodes (e.g., between the one or more electrodes 138) as the built-up charge arcs to other components and/or to an electrical ground. In extreme cases, behavior of the power supply 110 can be altered and distorted due to such arcing, thus resulting in unpredictable behavior of the ion beam 112, reduced beam currents and frequent preventive maintenance to clean these components. Additionally, flakes and other residue from these materials can form in the arc chamber 134 of the ion source assembly 108, thus altering its operational characteristics, leading to frequent cleaning, maintenance, and/or replacement of the ion source assembly.

The present disclosure contemplates the source material 132 comprising aluminum(III) iodide ($AlI_3$) to produce atomic aluminum ions, whereby the present disclosure advantageously mitigates or eliminates the formation and/or build-up of the aforementioned insulating materials, flakes, etc. When using aluminum(III) iodide ($AlI_3$) or other metallic iodide compounds in a solid state as the source material 132, a vaporizer 144 may be utilized to initially vaporize the source material. A resulting iodide byproduct (e.g., iodine)

may be formed, which, absent countermeasures, may subsequently coat an ion source housing 146 of the ion source assembly 108 and the extraction electrode assembly 136 with an insulating coating.

Accordingly, the present disclosure advantageously extends a lifetime of the ion source assembly 108 and associated electrodes, thereby producing a more stable ion beam 112, and allowing substantially higher beam currents than previously seen. The present disclosure, for example, may be utilized to produce single atom aluminum ions from solid aluminum(III) iodide ($AlI_3$) as the source material 132 in order to electrically dope a workpiece comprised of silicon carbide, silicon, or other material(s) at temperatures from room temperature to 1000° C., with improved source lifetimes, beam currents, and operational characteristics over conventional techniques.

The present disclosure appreciates that ion implantation processes may utilize halogen-based dopant gases or compounds (e.g., $BF_3$, $GeF_4$, $SiF_4$, $PF_3$, $SbF_3$, $NF_3$ and others), whereby cracking of these compounds produces fluorine byproducts that are highly electronegative and readily react with various refractory metals, graphite and ceramic components which make up the ion source assembly 108 and extraction electrode assembly 136.

To mitigate, minimize, or eliminate the negative effects of such dopant byproducts, a hydrogen bleed gas may be flowed into, or proximate to, the ion source housing 146 of the ion source assembly 108, whereby the hydrogen bleed gas reacts with residual fluorine forming HF and/or $H_2F$, thus rendering them less harmful, as less fluorinated carbon ($CF_x$) and fluorinated tungsten ($WF_x$) is subsequently formed. Fluorinated carbon and fluorinated tungsten are volatile conductive corrosive gases, whereby having lesser amounts of such material(s) available to react with various insulators is advantageous to the longevity of the ion source assembly 108. In the case of iodide-based metallic compounds, for example, resulting HI gas is volatile and can be removed via the vacuum source 128 associated with the ion source assembly 108, as opposed to depositing iodide on the various components of the ion source assembly 108.

For example, using Germanium tetrafluoride ($GeF_4$) with hydrogen as a co-gas in the ion source assembly 108, the following reactions can occur:

$$4GeF4+2H2+2W \rightleftharpoons 4Ge++2WF6+4HF(g) \quad (1)$$

and $$(g) \quad (2).$$

When $GeF_4$ is used without hydrogen as a co-gas, the following reactions can occur:

$$6GeF4+4W \rightleftharpoons 6Ge++4WF6 \quad (3)$$

and $$4WF6(g) \rightleftharpoons 4W(s)+24F\cdot(g) \quad (4).$$

Thermally speaking, the result of equation (4) is generally unstable, and a decomposition back to elemental tungsten (W) and release F back to the plasma may occur.

When aluminum(III) iodide $AlI_3$ is used with hydrogen as a co-gas, the following reaction can occur:

$$AlI3+H2+H2O \rightleftharpoons Al(s)+3HI(g)+OH \quad (5).$$

The water ($H_2O$) in equation (5), for example, arises from moisture in the chamber well. The kinetics of the reaction from iodide and hydrogen, for example, is favorable because it reduces the overall energy after forming the volatile gas by-product (HI), which is continuously being pumped away as it forms.

Several options for supplying or generating hydrogen gas for the ion source assembly 108 (e.g., the ion source housing 146) or arc chamber 134 are possible. For example, a high-pressure bottle containing hydrogen may be used as a gas source 148, whereby the high-pressure bottle may be fluidly coupled to the ion source assembly 108. In such an instance, for example, a small orifice (not shown) at the output of the gas source 148 may be utilized to prevent large volumes of gas being released, in case of a major failure associated therewith. Another alternative example of the gas source 148 for supplying hydrogen gas to the ion source assembly 108 or ion source housing 146 may comprise a vacuum-activated bottle that serves as a Safe Delivery System (SDS) utilizing a low pressure bottle (not shown), whereby the gas delivery line to the ion source assembly 108 is maintained under vacuum by the vacuum source 128.

Still another alternative example to supplying hydrogen gas to one or more of the ion source assembly 108, ion source housing 146 or arc chamber 134 comprises a hydrogen generator 150. It should be noted that while hydrogen gas and a hydrogen generator 150 are specifically recited, it should be understood that any gas and associated gas source 148 (e.g., gas bottles, gas generators, or other source of any gas) is contemplated as falling within the scope of the present disclosure. In one example, the hydrogen generator 150 may dissociate water using one or several electrolysis cells that are connected serially. While not shown, one of ordinary skill will understand that each electrolysis cell may comprise an anode electrode (e.g., for oxygen production), a cathode electrode (e.g., for hydrogen production), and a diaphragm (e.g., for separation of oxygen and hydrogen). Accordingly, a reservoir of the hydrogen generator 150 stores only enough hydrogen that is needed for the process, thereby making the hydrogen generator a safe alternative for applications where the presence of high pressure hydrogen bottles is a concern.

Figure 2:
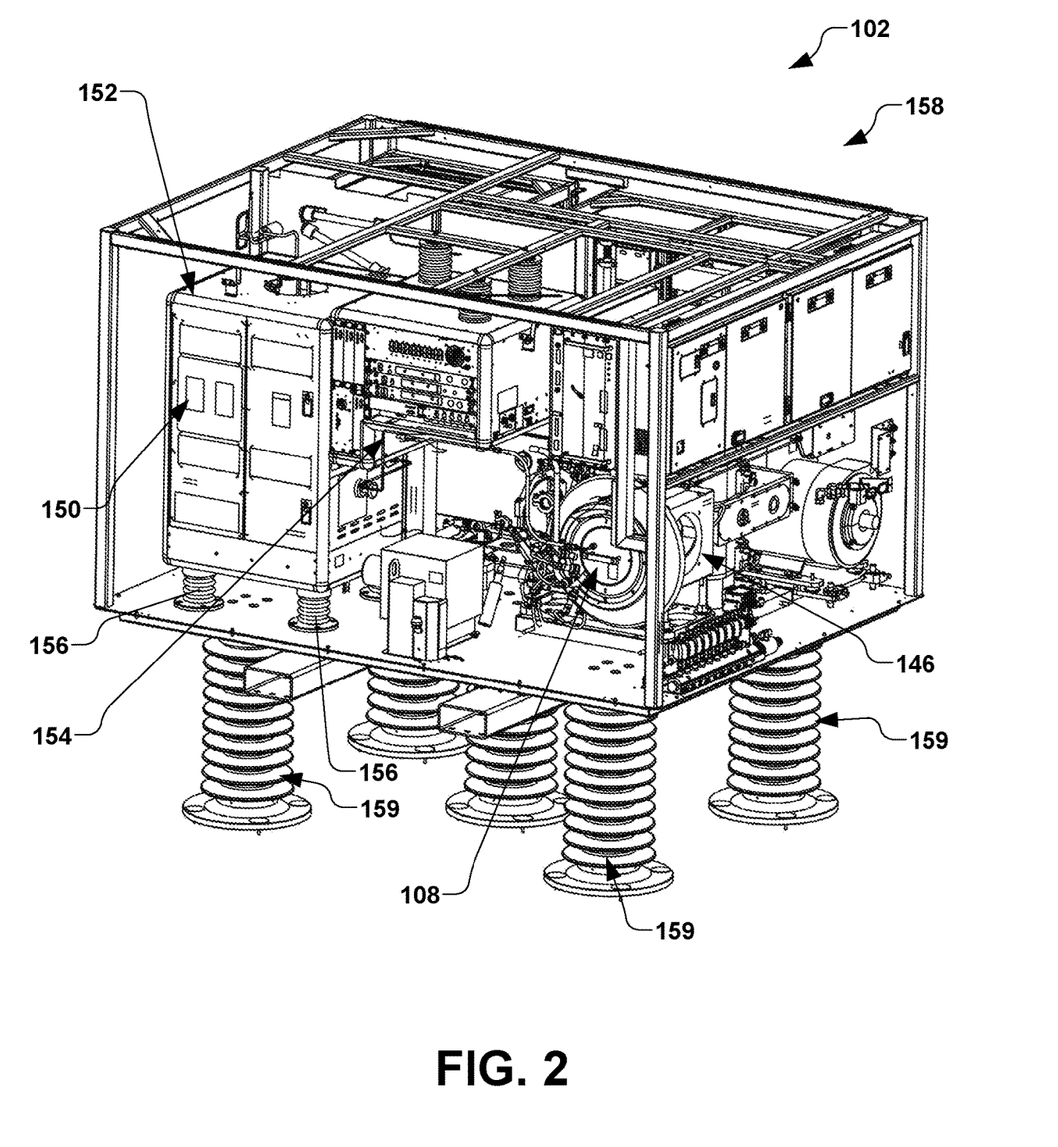
FIG. 2 illustrates a perspective view of an exemplary terminal comprising an ion source and gas box in accordance with another aspect of the present disclosure.
Figure 4:
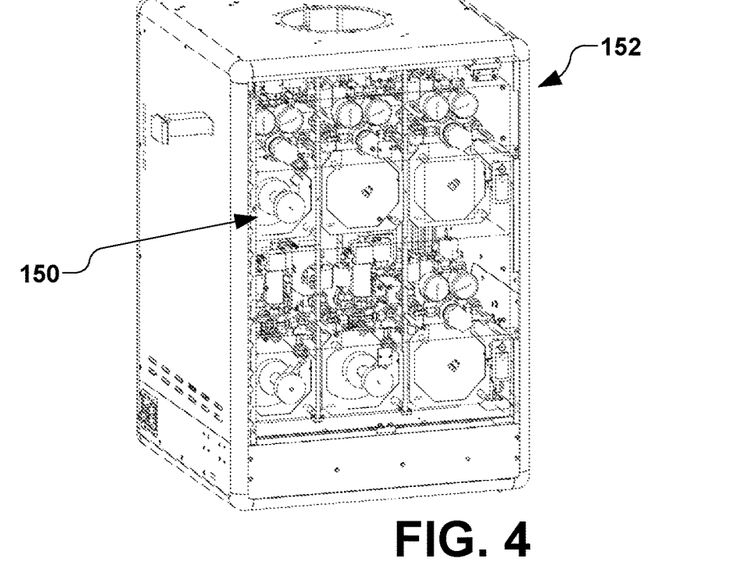
FIG. 4 illustrates a perspective view of an exemplary gas box according to another aspect of the present disclosure.

The present disclosure contemplates providing the hydrogen generator 150 in a gas box 152 associated with the terminal 102, whereby the gas box is at an extraction potential of the ion source assembly 108 (e.g., the gas box is at the same high potential or extraction voltage as the ion source), and whereby an output of the hydrogen generator can be plumbed directly into the ion source assembly for use as co-gas using a conductive tubing 154 (e.g., a stainless steel tube). Thus, safety and containment features of the gas box 152 can be utilized, whereby concerns of bridging a high voltage gap with a non-conductive tubing can be avoided. For example, non-conductive tubing can be easily damaged, thus potentially releasing flammable hydrogen and/or a toxic dopant in a vicinity external to the ion source assembly 108, yet internal the ion source housing 146. The gas box 152, such as illustrated in FIG. 4, for example, is an enclosure in the terminal 102 shown in FIGS. 1-2, and is associated with the ion source assembly 108, whereby pressurized gas bottles containing various gasses associated with the implant may be further located. By positioning the hydrogen generator 150 in the gas box 152 (which is already at an elevated voltage from electrical ground), the containment and safety aspects of the gas box enclosure can be utilized, thus avoiding duplicate designs/hardware including the gas delivery piping.

Conventionally, a gas box is maintained at an extraction potential (e.g., an elevated potential from ground) that may range from approximately 1 keV to 60 keV. The present disclosure appreciates that conventionally, when implementing a stand-alone hydrogen generator (not shown) for production of a hydrogen co-gas for an ion source, the stand-alone hydrogen generator is placed on the floor at ground potential outside the terminal. At such a ground potential, the stand-alone hydrogen generator can be at an electrical potential that is significantly lower than the ion source. As such, non-conductive tubing such as polyethylene (e.g., Poly-Flo®) or Teflon® tubing has been conventionally utilized to cross a high-voltage gap between electrical ground and the terminal in order to transfer the gas into the gas box to connect to a flow controller to flow the hydrogen gas into the ion source, itself. However, the present disclosure appreciates that such use of non-conductive tubing to cross the high-voltage gap has various detrimental deficiencies, such as being a trip hazard, as well as having the potential of leaking potentially explosive hydrogen gas into the nearby environment.

Figure 5:
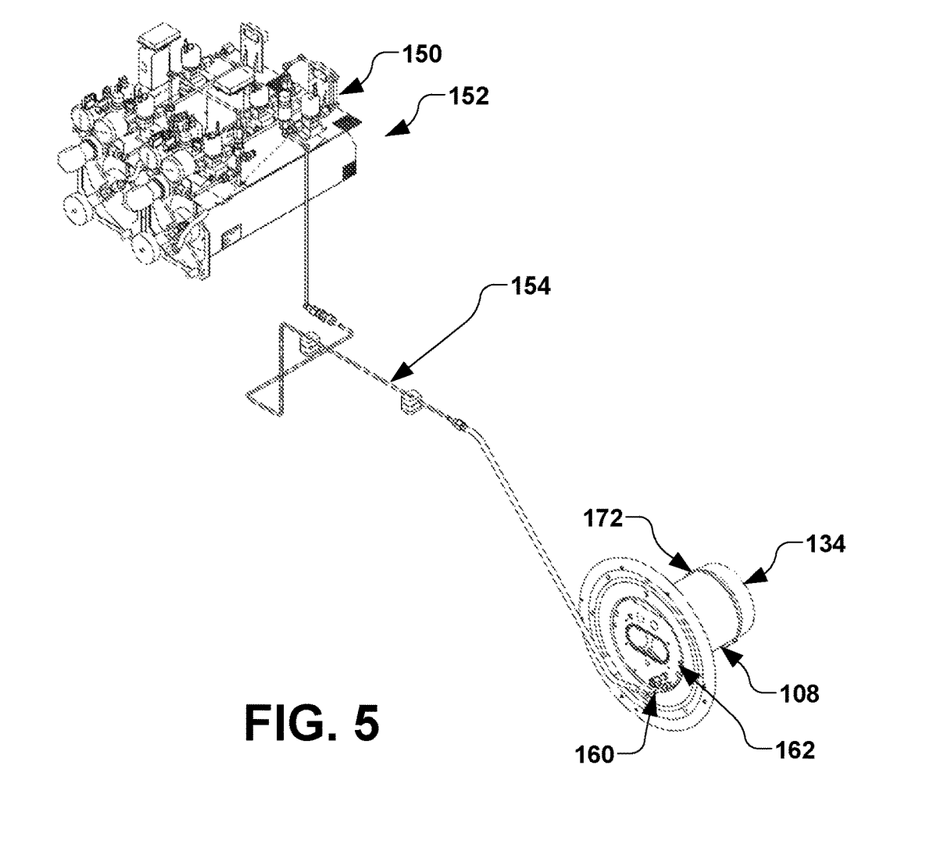
FIG. 5 illustrates a perspective view of an exemplary bleed gas conduit according to another aspect of the present disclosure.

Thus, in accordance with one exemplary aspect of the present disclosure, the hydrogen generator 150 is provided and sized to fit in a slot where a conventional gas bottle is normally placed in the gas box 152. As such, various safety features are provided, whereby the hydrogen gas may be injected into the ion source assembly 108 while being at the same electrical potential as the ion source assembly. The gas box 152, for example, rests on a plurality of electrical insulators 156, whereby the gas box and various controllers (not shown) for the ion source assembly 108 are at the same electrical potential as the ion source. Thus, by positioning the hydrogen generator 150 in the gas box 152, no voltage drop is present between the hydrogen generator and the ion source assembly 108. Further, fluid connections from the hydrogen generator 150 in the gas box 152 to the ion source 108 can advantageously comprise conductive tubing 154, such as stainless steel tubing, whereby the conductive tubing provides a robust and safe fluid coupling therebetween, as illustrated in FIG. 5.

Figure 3:
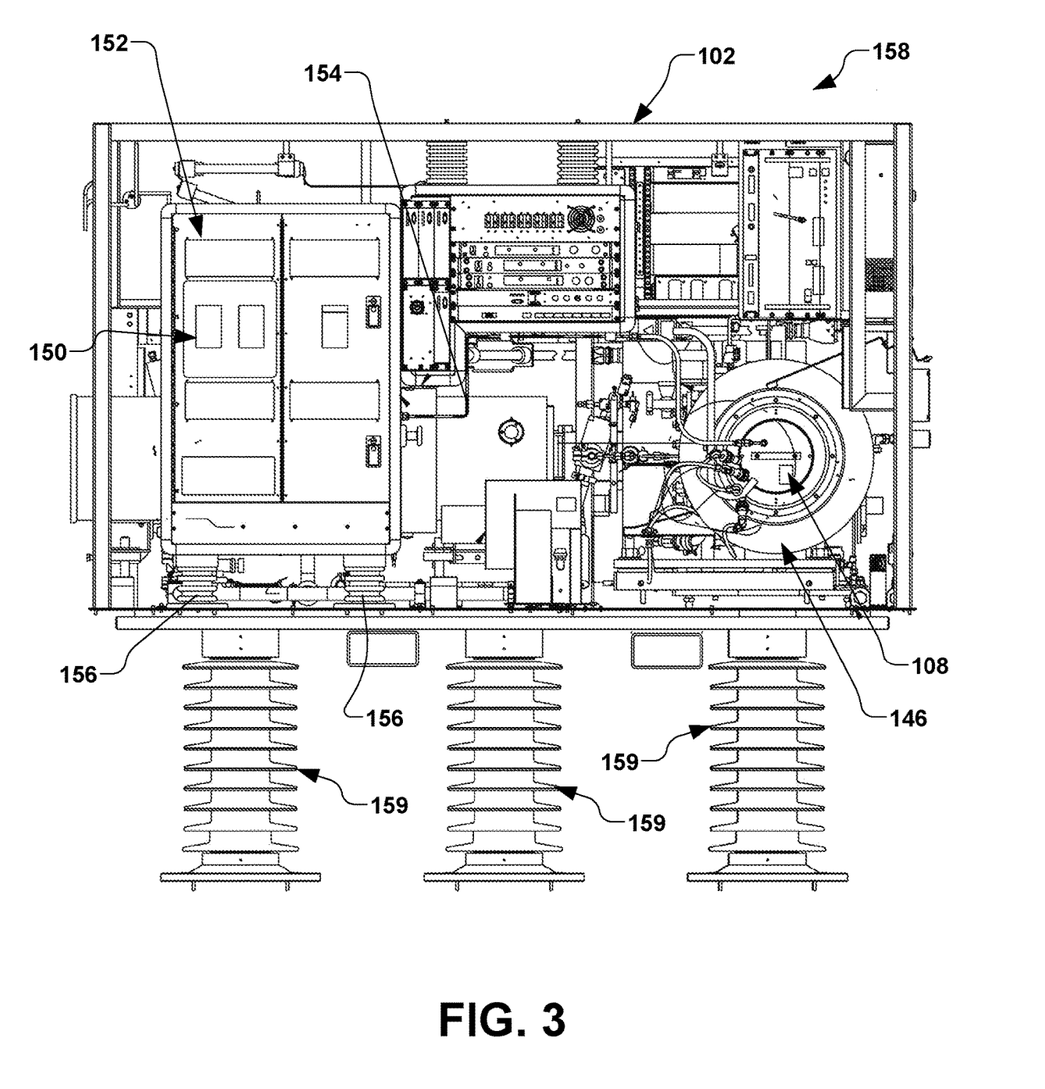
FIG. 3 illustrates a plan view of an exemplary terminal comprising an ion source and gas box in accordance with another aspect of the present disclosure.

The present disclosure advantageously thus provides a gas (e.g., hydrogen gas) that is at an elevated voltage above a ground reference. As such, various containment apparatus and controls, etc. need not be duplicated to mitigate sparks associated with a low flow of a flammable gas. A high-pressure gas bottle (e.g., a hydrogen bottle) may alternatively be placed in the gas box 152 of FIG. 3 or 4 for providing the gas to the ion source assembly 108. The hydrogen generator 150 of FIG. 3, for example, may flow hydrogen gas at a rate of approximately 10 sccm. In one example, the hydrogen generator 150 has relatively small storage capacity of approximately 70 psi or less. As such, the hydrogen gas is not stored at high pressures (e.g., 2000 psi) that are typically associated with the high pressure gas bottles discussed above. Further, the hydrogen generator 150 is maintained at the same potential as the ion source assembly 108 (e.g., an elevated voltage above electrical ground), which can be approximately 1 keV to 60 keV above ground potential.

According to another exemplified aspect, the present disclosure provides a terminal system 158 for the ion implantation system 101, wherein the terminal system comprises the hydrogen generator 150 that is at the same electrical potential as the ion source assembly 108. The terminal system 158, for example, may be electrically isolated from earth ground by a plurality of insulating standoffs 159. Since the terminal system 158 is electrically insulated from earth ground via the insulating standoffs 159, the terminal system can be considered a ground reference (e.g., a return reference), whereby the terminal 102 can be biased to various voltages, such as approximately positive 300 keV in relation to earth ground. The gas box 152 and ion source assembly 108, for example, are coupled with the conductive tubing 154 discussed above, and are thus at the same potential as one another, whereby both the gas box and ion source can be at an elevated potential (e.g., 60 keV) above the terminal 102 while being further insulated from the terminal by the electrical insulators 156, thus providing the gas box and ion source at 300 keV above ground potential.

Figure 6:
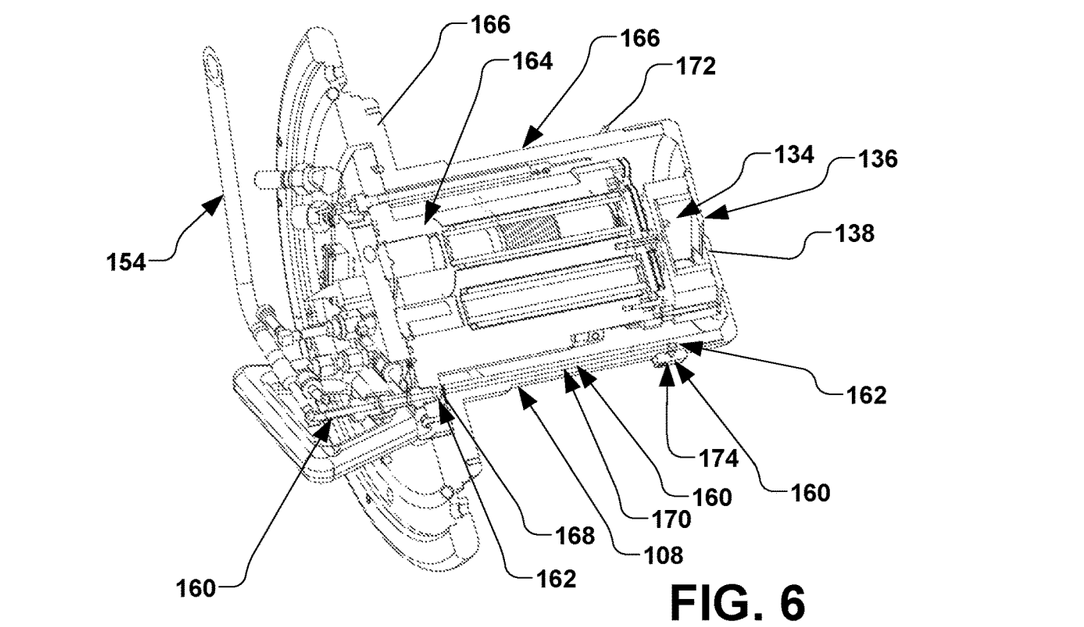
FIG. 6 illustrates a perspective view of an exemplary ion source according to another aspect of the present disclosure.

The present disclosure further provides an apparatus and method for introducing a bleed gas into the housing 146 of the ion source assembly 108 (e.g., at earth ground, terminal potential, and/or return potential) via a bleed gas conduit 160 illustrated in FIG. 6, whereby safety and containment associated with the gas box 152 (e.g., at an elevated potential such as extraction potential) is leveraged. The bleed gas may be provided from one or more of the gas box 152 or any bleed gas source (not shown).

The bleed gas, for example, may comprise a reactive gas, such as hydrogen, wherein the bleed gas reacts with undesirable byproduct(s) associated with cracking of the primary dopant. For example, the bleed gas may comprise hydrogen, wherein the hydrogen reacts with iodides associated with a primary dopant species of aluminum iodide. Alternatively, the bleed gas may comprise an inert gas, such as xenon, wherein the inert gas may perform functions such as supplying electrons and reducing a space charge to aid in stabilization of the ion beam. For example, the bleed gas may comprise one or more of an inert gas that readily gives up an electron, and/or a reactive gas to react with one or more undesirable byproducts associated with cracking of the primary dopant. For example, hydrogen may be utilized as the bleed gas in order to react with fluorine to prevent etching or other deleterious reactions with various components of the ion source assembly 108 and ion source housing 146 whereby the fluorine reacts with hydrogen from the bleed gas and is pumped out.

The bleed gas, for example, can be introduced via the bleed gas conduit 160 comprising one or more feed-throughs 162 that penetrate through a body 164 of the ion source assembly 108 and its associated mounting components such as a mounting flange 166 of the ion source, as illustrated in FIG. 6, all of which are at an elevated voltage (e.g., at extraction potential). In one example, the one or more feed-throughs 162 comprise a hole 168 in the mounting flange 166 of the ion source assembly 108 and continues through a cross-section of a tubular portion 170 of the mounting flange, where it further connects to a gas distribution apparatus 172. The bleed gas conduit 160, for example, may be any conduit (e.g., tubing, channel, line, etc.) that is configured to provide the bleed gas to anywhere within the ion source housing 146 of the ion source assembly 108. For example, the hydrogen generator 150 within the gas box 152 is configured to supply both the co-gas and the bleed gas to both of the arc chamber 134 and the ion source assembly 108. For example, one or more conduits or feed lines supply the both the co-gas and bleed gas to within the respective arc chamber 134 and ion source assembly 108. In one example, a tee (not shown) may be utilized to separate flows to the respective arc chamber 134 and ion source assembly 108. Respective flow controllers (not shown) may likewise be utilized to control the respective flows of gas.

The gas distribution apparatus 172, for example, is configured to direct the bleed gas in a desired direction or toward a desired apparatus, such as toward the extraction electrode assembly 136 or mounting flange 166 of the ion source assembly 108, or any desired location. The extraction electrode assembly 136 may comprise one or more aperture plates, such as a ground plate. The bleed gas conduit 160, for example, may be configured to introduce the gas to a region generally internal to the ion source housing 146 of the ion source assembly 108 and upstream of one or more of the one or more aperture plates (e.g., an aperture plate associated with the extraction electrode assembly 136), such as upstream of a ground plate. While the gas distribution apparatus 172 is illustrated as being upstream of extraction electrode assembly 136 in the present example illustrated in FIGS. 6-7, in other examples, the gas distribution apparatus may be positioned anywhere within the ion source housing 146 of the ion source assembly 108. The gas distribution apparatus 172 may alternatively comprise a distribution bar having one or more holes defined therein for the distribution of the bleed gas. The one or more holes, for example, may be defined in the gas distribution apparatus 172 such that the bleed gas is directed in one or more desired directions, such as pointing upstream and/or downstream of the ion source assembly 108. The gas distribution apparatus 172, for example, may comprise one or more tubes or other conduits pointing in desired direction, wherein each of the one or more tubes comprises at least one orifice for directing the flow of the bleed gas in a desired direction or toward a desired location within the housing. The gas distribution apparatus 172 may be provided within the ion source housing 146 anywhere upstream of beamguide 114 of FIG. 1.

Figure 7:
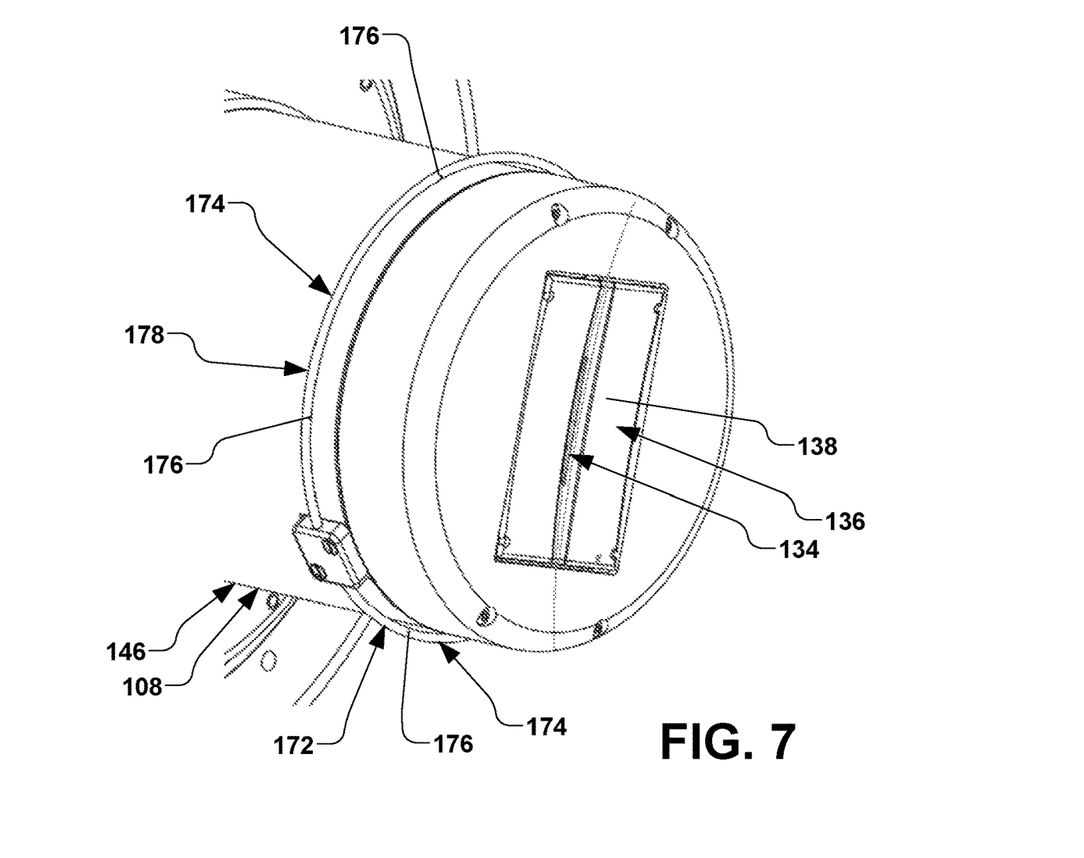
FIG. 7 illustrates a partially blown-up view of a portion of the ion source of FIG. 6 according to another aspect of the present disclosure.

In one particular example, the gas distribution apparatus 172 comprises a gas distribution ring 174, as illustrated in greater detail in FIG. 7. The gas distribution ring 174, for example, comprises a plurality of distribution holes 176 located around a circumference 178 of the gas distribution ring. The plurality of distribution holes 176, for example, may be defined in an outer diameter of the gas distribution ring 174, or may comprise one or more orifices, through-holes, or apertures in a gas distribution tube (not shown) that are configured to direct the flow of the bleed gas forward and/or backward, or at any angle with relation to the ion source assembly 108 to provide uniform or non-uniform distribution of the bleed gas.

The gas distribution ring 174, for example, is positioned internal to the housing 146 of the ion source assembly 108. Accordingly, additional costs associated with redundant safety and containment measures are mitigated or eliminated, whereby the gas distribution ring 174 can be further utilized with other types or species of bleed gas, such that unwanted by products or by-products of the primary dopant gases can be accordingly "reacted out", chemically. The gas distribution ring 174 and/or or one or more feed-throughs 162 of FIG. 6, for example, can increase the probability that undesirable by-products are advantageously "reacted out" or rendered less harmful prior to reaching insulators and or other surfaces where unreacted by-products would be problematic.

The gas distribution apparatus 172, for example, may be provided at various potentials, such as ground potential, a return potential relative to earth ground, or a return potential at elevated potential. A flow of the bleed gas to the gas distribution apparatus 172, for example, may be tuned to a plurality of bleed flow rates. For example, for a double-charged ion, hydrogen tends to neutralize the double charge and lose beam current, whereby an approximately 3 sccm flow rate may be adequate. For single-charge ion, for example, the flow rate may be tuned to approximately 8 sccm. Accordingly, the flow rate of the bleed gas may be determined based on one or more of the species of implant, a charge state, and an energy associated with the desired implantation to be performed. Further, the flow rate and/or pressure of the bleed gas may be based, at least in part, on a Paschen curve associated with gas pressure between a particular high voltage gap. For example, a pressure limit for the bleed gas may be provided, such that the pressure of the bleed gas may be limited to below a safe threshold pressure (e.g., bleed gas pressure not to exceed $5 \times 10^{-4}$ torr).

The hydrogen generator 150 of the present disclosure, for example, may be further configured to feed hydrogen bleed gas into the ion source housing 146, whereby the ion source housing can be at earth ground or at a terminal voltage (e.g., ground reference or return). For example, as illustrated in FIG. 1, a hydrogen generator 180 may be further provided as a chamber bleed, whereby the hydrogen generator may be operably connected to a gas ring or gas tube or tubes to distribute the hydrogen gas. The hydrogen generator 180, for example, need not be located in the gas box 152, whereby the hydrogen generator may be electrically coupled to earth ground and/or a ground or return reference at an elevated potential above ground.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A terminal system for an ion implantation system, wherein the terminal system comprises:
   an ion source housing;
   an ion source assembly positioned within the ion source housing, wherein the ion source assembly comprises an extraction electrode assembly having one or more aperture plates;
   a gas box electrically coupled to the ion source assembly;
   a gas source disposed within the gas box, wherein the gas source is configured to provide a gas at the same electrical potential as the ion source assembly; and
   a bleed gas conduit associated with the ion source assembly, wherein the bleed gas conduit is configured to introduce the gas to a region internal to the ion source housing, wherein the region is further external to the ion source assembly and upstream of one or more of the one or more aperture plates.

2. The terminal system of claim 1, wherein the bleed gas conduit comprises one or more feed-throughs extending through a body of the ion source assembly.

3. The terminal system of claim 2, wherein the one or more feed-throughs comprise a hole in a mounting flange of the ion source assembly.

4. The terminal system of claim 3, wherein the mounting flange comprises a tubular portion having a channel defined therein.

5. The terminal system of claim 4, wherein bleed gas conduit further comprises a gas distribution apparatus.

6. The terminal system of claim 5, wherein the gas distribution apparatus comprises a gas distribution ring.

7. The terminal system of claim 6, wherein the gas distribution ring generally encircles the tubular portion of the mounting flange.

8. The terminal system of claim 5, wherein the gas distribution apparatus comprises a plurality of distribution holes located around a circumference thereof.

9. The terminal system of claim 1, wherein the gas distribution apparatus is positioned external to the ion source assembly and upstream of a ground plate of the extraction electrode assembly.

10. The terminal system of claim 1, wherein the gas source comprises a hydrogen generator configured to generate hydrogen gas.

11. The terminal system of claim 1, wherein the ion source and gas box are electrically isolated from a remaining portion of the terminal system via a plurality of electrical insulators.

12. The terminal system of claim 1, further comprising a plurality of insulating standoffs, whereby the plurality of insulating standoffs electrically isolate the terminal system from earth ground.

13. The terminal system of claim 1, wherein the gas comprises one of a reactive gas and an inert gas.

14. The terminal system of claim 13, wherein the reactive gas comprises hydrogen gas.

15. The terminal system of claim 13, wherein the inert gas comprises xenon.

16. An ion source, comprising:
   an ion source housing and an extraction electrode assembly disposed therein having one or more aperture plates;
   a hydrogen gas source configured to provide hydrogen gas at the same electrical potential as the ion source; and
   a bleed gas conduit associated with the ion source housing, wherein the bleed gas conduit comprises a gas distribution ring fluidly coupled to the hydrogen gas source, wherein the gas distribution ring generally encircles a tubular portion of the ion source housing, and wherein the bleed gas conduit is configured to introduce the hydrogen gas to a region generally internal to the ion source housing and upstream of one or more of the one or more aperture plates of the extraction electrode.

17. The ion source of claim 16, wherein the gas distribution ring comprises a plurality of distribution holes located around a circumference thereof, and wherein the gas distribution ring is positioned internal to the ion source housing and upstream of a ground plate of the extraction electrode assembly.

18. The ion source of claim 16, wherein the hydrogen gas source comprises a hydrogen generator.

19. An ion implantation system, comprising:
   a terminal comprising:
      a gas box having a hydrogen generator configured to produce hydrogen gas; and
      an ion source assembly configured to form an ion beam, wherein the ion source assembly comprises an ion source housing comprising an arc chamber and an extraction electrode assembly, wherein the ion source assembly further comprises a bleed gas conduit configured to introduce gas to a region generally internal to the ion source housing and upstream of the extraction electrode assembly, wherein the region is further external to the arc chamber, and wherein the ion source assembly and the gas box are at the same electrical potential;
   a beamline assembly configured to selectively transport the ion beam; and
   an end station configured to accept the ion beam for implantation of ions into a workpiece.

* * * * *